(12) United States Patent
Hebenstreit et al.

(10) Patent No.: US 8,953,292 B2
(45) Date of Patent: Feb. 10, 2015

(54) BUS INTERFACE AND METHOD FOR SHORT-CIRCUIT DETECTION

(75) Inventors: Andreas Hebenstreit, Egling (DE); Werner Höllinger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 799 days.

(21) Appl. No.: 11/755,339

(22) Filed: May 30, 2007

(65) Prior Publication Data

US 2008/0297962 A1 Dec. 4, 2008

(51) Int. Cl.
| | |
|---|---|
| H02H 3/00 | (2006.01) |
| H03K 17/687 | (2006.01) |
| G06F 13/40 | (2006.01) |
| H03K 17/082 | (2006.01) |
| H03K 19/003 | (2006.01) |

(52) U.S. Cl.
CPC ........ *H03K 17/6872* (2013.01); *G06F 13/4072* (2013.01); *H03K 17/0822* (2013.01); *H03K 19/00315* (2013.01)
USPC .......................................................... 361/86

(58) Field of Classification Search
USPC .......................................................... 361/86
See application file for complete search history.

(56) References Cited

U.S. PATENT DOCUMENTS

| | | | |
|---|---|---|---|
| 4,617,622 A * | 10/1986 | Fox | 363/98 |
| 4,771,357 A | 9/1988 | Lorincz et al. | |
| 5,256,914 A | 10/1993 | Boomer | |
| 5,553,229 A * | 9/1996 | Margolin | 345/564 |
| 5,574,346 A * | 11/1996 | Chavan et al. | 318/434 |
| 5,789,943 A | 8/1998 | Wong | |
| 5,969,926 A * | 10/1999 | Whittaker | 361/101 |
| 6,034,857 A | 3/2000 | Sample | |
| 6,597,553 B2 * | 7/2003 | Chilcote et al. | 361/88 |
| 6,621,336 B1 * | 9/2003 | Johnson | 330/51 |
| 6,621,339 B2 | 9/2003 | Tripathi | |
| 6,701,401 B1 | 3/2004 | Lu et al. | |
| 6,946,904 B1 | 9/2005 | Varma | |
| 6,967,488 B1 | 11/2005 | Arigliano | |
| 7,295,414 B2 * | 11/2007 | Yang et al. | 361/93.9 |
| 2005/0058086 A1 * | 3/2005 | Borkenhagen et al. | 370/257 |
| 2005/0134309 A1 * | 6/2005 | Komatsu et al. | 326/47 |
| 2007/0007912 A1 | 1/2007 | Yang | |
| 2007/0019350 A1 | 1/2007 | Blackwell | |

FOREIGN PATENT DOCUMENTS

| | | |
|---|---|---|
| EP | 0986173 A1 | 3/2000 |
| JP | 5335926 | 12/1993 |
| SU | 667966 A * | 6/1979 |

* cited by examiner

*Primary Examiner* — Rexford Barnie
*Assistant Examiner* — Ann Hoang
(74) *Attorney, Agent, or Firm* — SpryIP, LLC

(57) ABSTRACT

Embodiments of bus interface circuitry and methods for short circuit detection are generally described herein. Other embodiments may be described and claimed. In some embodiments, the bus interface circuitry comprises logic circuitry to compare a driver stage output signal at a bond pad to internal reference voltages to generate control signals indicative of whether a short-circuit condition exists on a bus. The driver stage of the bus interface may be temporarily disabled when a short-circuit condition is indicated by the control signals.

21 Claims, 3 Drawing Sheets

BUS INTERFACE AND METHOD FOR SHORT-CIRCUIT DETECTION

TECHNICAL FIELD

Some embodiments pertain to wireline communication systems. Some embodiments pertain to bus interfaces, such as universal serial bus (USB) interfaces.

BACKGROUND

Interface drivers, such as USB interface drivers, should not be damaged when short circuits occur in the digital signal lines. Interface specifications generally require that short circuits should be tolerated without damage to the interface. These interface specifications sometimes also require that the interface should continue to operate normally when the short-circuit condition has been eliminated.

Thus, there are general needs for interfaces and methods that allow an interface to tolerate a short-circuit condition without damage and allow the interface to return to normal operations when the short-circuit condition no longer exists.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
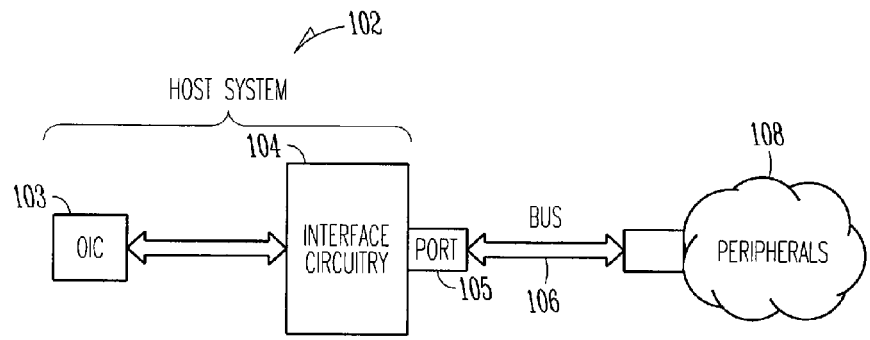
FIG. 1 illustrates a wireline communication system in accordance with some embodiments of the present invention.

FIG. 1 illustrates a wireline communication system in accordance with some embodiments of the present invention. Communication system 100 comprises host system 102 and one or more peripherals 108 which communicate over bus 106. Host system 102 may include interface circuitry 104 to interface with bus 106 and other internal circuitry (OIC) 103 to control bus 106 and operate host system 102. Bus 106 may be a serial bus, such as universal serial bus (USB), although the scope of the invention is not limited in this respect. In some of these embodiments, interface circuitry 104 may include serial port 105, such as a USB port, which may include one or more signal lines and/or one or more bus-voltage lines.

In accordance with some embodiments of the present invention, interface circuitry 104 may include a driver stage and evaluation logic. Core logic within OIC 103 may provide signals to interface circuitry 104, and the driver stage may provide the signals over bus 106. The evaluation logic may compare a driver stage output signal at a bond pad to internal reference voltages to generate control signals. The control signals may be used to temporarily disable the driver stage when a short-circuit condition is indicated by at least one of the control signals. These embodiments are described in more detail below.

Although wireline communication system 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), radio-frequency integrated circuits (RFICs) and combinations of various hardware and logic circuitry for performing at least the functions described herein. In some embodiments, the functional elements of wireline communication system 100 may refer to one or more processes operating on one or more processing elements.

Figure 2:
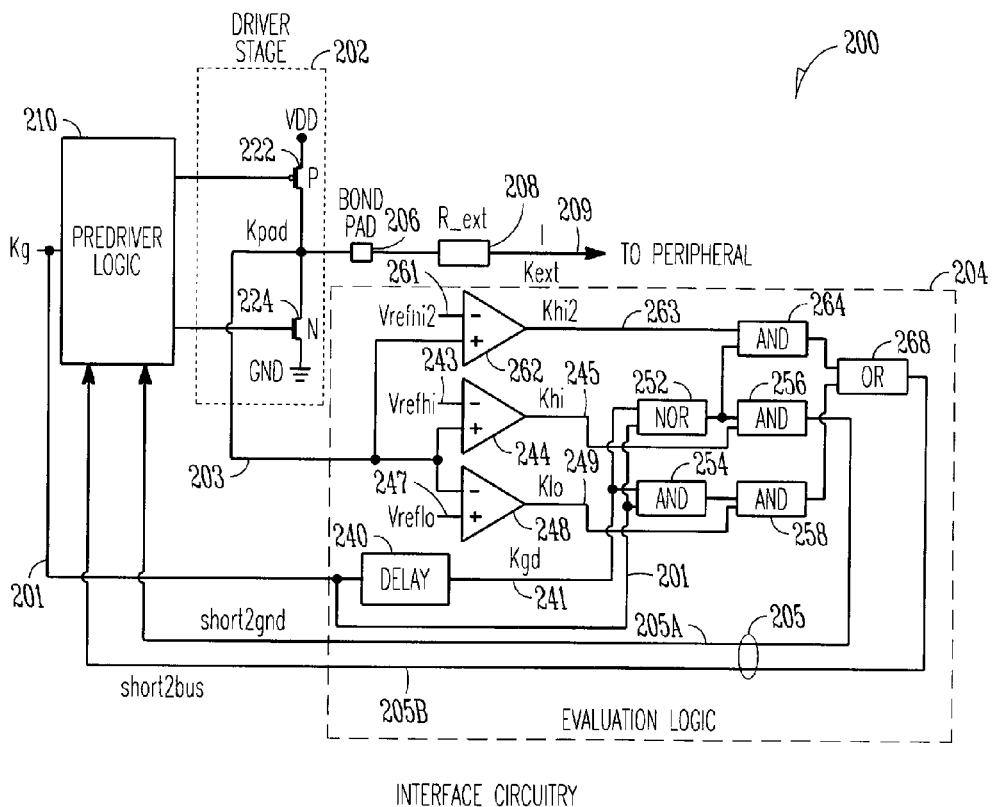
FIG. 2 illustrates interface circuitry in accordance with some embodiments of the present invention.

FIG. 2 illustrates interface circuitry in accordance with some embodiments of the present invention. Interface circuitry 200 may be suitable for use at least as part of interface circuitry 104 (FIG. 1), although other circuitry may also be suitable. Interface circuitry 200 may include driver stage 202, evaluation logic 204, and predriver logic 210. Interface circuitry 200 may provide an output signal on output signal path 209 to bus 106 (FIG. 1) based on input signal 201. Driver stage 202 may receive input signal 201 and generate driver stage output signal (Kpad) 203. Evaluation logic 204 may determine when a short-circuit condition exists on output signal path (Kext) 209 based on a voltage level at bond pad 206. As illustrated, driver stage output signal 203 may be provided to bond pad 206 by driver stage 202. Predriver logic 210 may disable driver stage 202 when a short-circuit condition is indicated by one of control signals 205. In some embodiments, predriver logic 210 may re-enable drive stage 202 either after a predetermined period of time or when none of control signals 205 indicate that a short-circuit condition exists.

Interface circuitry 200 may include series resistive element (R_ext) 208 in output signal path 209 as illustrated. In some embodiments, series resistive element 208 may be an external non-reactive resistor, although the scope of the invention is not limited in this respect. By disabling driver stage 202 at certain times during short-circuit conditions, damage to resistive element 208 may be prevented. These embodiments are discussed in more detail below. In some embodiments, resistive element 208 may be part of host system 102 (FIG. 1) and may provide a more precise resistance than what would be realized on a chip device of interface circuitry 200.

In some embodiments, control signals 205 may include short-to-ground control signal (short2gnd) 205A and short-to-bus control signal (short2bus) 205B. Evaluation logic 204 may include comparator 244 to compare driver stage output signal 203 at bond pad 206 with high reference voltage (Vrefhi) 243, and comparator 248 to compare driver stage output signal 203 at bond pad 206 with low reference voltage (Vreflo) 247. Evaluation logic 204 may also include logic elements 252 and 256 to generate short-to-ground control signal 205A when driver stage output signal 203 fails to exceed high reference voltage 243. Evaluation logic 204 may also comprise logic elements 254 and 258, which in some embodiments, may generate short-to-bus control signal 205B when driver stage output signal 203 fails to fall below low reference voltage 247. In these embodiments, elements 262, 264 and 268 may be optional when logic element 258 is used to generate short-to-bus control signal 205B.

Logic elements 252 and 256 may generate short-to-ground control signal 205A when driver stage output signal 203 fails to exceed high reference voltage 243 when both input signal 201 and delayed-version of input signal 241 are at a low state. In embodiments that do not include optional elements 262, 264 and 268, logic elements 254 and 258 may generate short-to-bus control signal 205B when driver stage output signal 203 fails to fall below low reference voltage 247 when both input signal 201 and delayed-version of input signal 241 are at a high state.

Predriver logic 210 may disable driver stage 202 when either short-to-ground control signal 205A or short-to-bus control signal 205B indicates a short-circuit condition. A short-circuit condition may be indicated when either short-to-ground control signal 205A or short-to-bus control signal 205B is at a high state, although the scope of the invention is not limited in this respect. Predriver logic 210 may re-enable driver stage 202 when neither short-to-ground control signal 205A nor short-to-bus control signal 205B indicate a short-circuit condition. In some embodiments, predriver logic 210 may re-enable (e.g., reactivate) driver stage 202 after a predetermined period of time (e.g., a retry period). When no short-circuit condition exists, both short-to-ground control signal 205A and short-to-bus control signal 205B may be at a low state, although the scope of the invention is not limited in this respect.

In some embodiments, logic elements 252 and 256 may refrain from generating short-to-ground control signal 205A when input signal 201 and delayed-version of input signal 241 are not both at the low state. In embodiments that do not include optional elements 262, 264 and 268, logic elements 254 and 258 may refrain from generating short-to-bus control signal 205B when input signal 201 and delayed-version of input signal 241 are not both at the high state. During these times, short-circuit conditions are not always detected, although the scope of the invention is not limited in this respect. These situations are described in more detail below.

In some embodiments, driver stage 202 may comprise switching transistors 222 and 224. Evaluation logic 204 may further comprise delay element 240 to delay input signal 201 and generate delayed version of input signal 241. Delay element 240 may delay input signal 201 by either a high-to-low or a low-to-high transition time of driver stage output signal 203. In some embodiments, the amount of delay time may be determined by resistive-capacitive (RC) elements, inverter chains or a counter circuit. In some USB embodiments, delay element 240 may delay input signal 201 a few tens of nanoseconds, although the scope of the invention is not limited in this respect.

In some embodiments, switching transistor 222 may be a P-type transistor and switching transistor 224 may be an N-type transistor, although the scope of the invention is not limited in this respect. In some embodiments, predriver logic 210 may cause driver stage 202 to be in a high-ohmic state (i.e., tristate) when a short-circuit condition is indicated by any one of control signals 205. When in tristate, both transistors 222 and 224 may have a high output impedance, although the scope of the invention is not limited in this respect.

In some embodiments, logic element 252 may comprise NOR-gate 252 to indicate when both input signal 201 and delayed version of input signal 241 are at a low-state. Logic element 256 may comprise AND-gate 256 to generate short-to-ground control signal 205A when both output (Khi) 245 from comparator 244 and output from NOR-gate 252 are at a high-state. Logic element 254 may comprise AND-gate 254 to indicate when both input signal 201 and delayed version of input signal 241 are at a high-state. Logic element 258 may comprise AND-gate 258 to generate short-to-bus control signal 205B (in embodiments that do not include elements 262, 264 and 268) when both output (Klo) 249 from comparator 248 and the output from AND-gate 254 are at a high-state.

In embodiments that include elements 262, 264 and 268, comparator 262 may compare driver stage output signal 203 at bond pad 206 with high reference voltage (Vrefhi2) 261. AND gate 264 may be responsive to output (Khi2) 263 of comparator 262 and NOR gate 252, and OR gate 268 may be responsive to the output of AND gate 258 and AND gate 264. In these embodiments, short-to-bus control signal 205B may be generated by OR gate 268 rather than AND gate 258. These optional embodiments may be used to detect when an output signal line is at a high state and is shorted to the bus voltage. These embodiments are discussed in more detail below.

In some embodiments, interface circuitry 200 may be a USB interface, although the scope of the invention is not limited in this respect. In some of these embodiments, interface circuitry 200 may comprise a driver stage, such as driver stage 202, evaluation logic, such as evaluation logic 204, and logic, such as predriver logic 210, for each signal line (e.g., D+ and D−) of the interface. In some embodiments, a short-circuit condition may comprise a short between a signal line and earth, or a short between a signal line and a bus voltage (e.g., 4.5 v . . . 5.25 v), although the scope of the invention is not limited in this respect.

Figure 3:
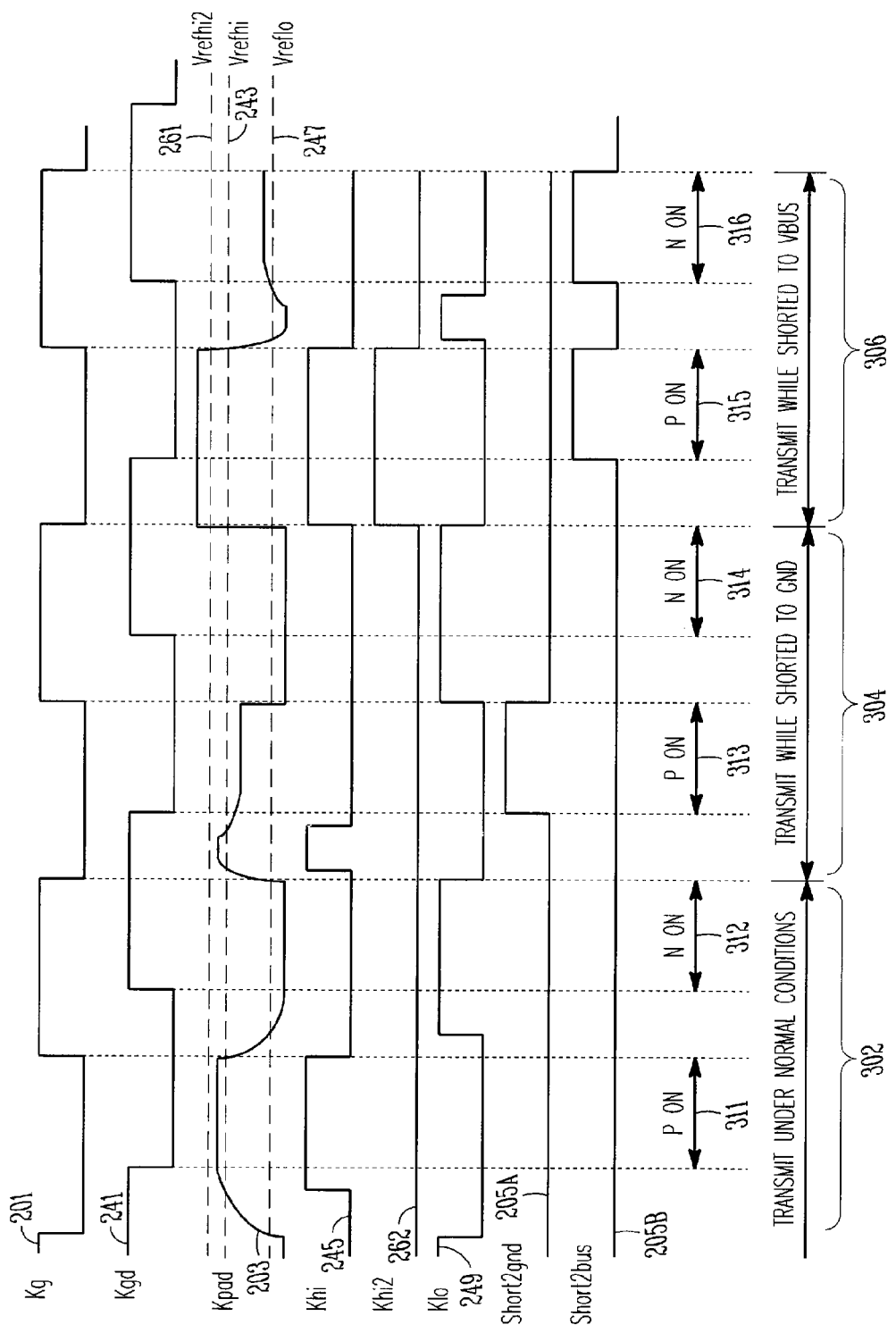
FIG. 3 illustrates signal profiles of some signals in accordance with some embodiments of the present invention.

FIG. 3 illustrates signal profiles of some signals in accordance with some embodiments of the present invention. The signals referenced on the left of FIG. 3 are examples of various signals and voltage levels corresponding to signals illustrated in FIG. 2 and illustrate the operation of some embodiments of the present invention. An example of input signal (Kg) 201 is illustrated along with delayed version of input signal (Kgd) 241. In response to input signal 201, during time windows 311, 313 and 315, transistor 222 (FIG. 2) may be turned on. During time windows 312, 314 and 316, transistor 224 (FIG. 2) may be turned on. During period 302, bus 106 (FIG. 1) may transmit data and operate under normal operating conditions. During period 304, a signal path of bus 106 (FIG. 1) may be shorted to ground, and during period 306, a signal path of bus 106 (FIG. 1) may be shorted to a bus voltage. During period 302, after a transition time, driver stage output signal 203 crosses either reference voltage 243 or reference voltage 247. To prevent a short circuit from incorrectly being indicated, driver stage output signal 203 is evaluated after a transition time period through the use of delayed version of input signal 241.

Referring to FIGS. 2 and 3, during period 304 when a signal path is shorted to ground, logic elements 252 and 256 may generate short-to-ground control signal 205A when driver stage output signal 203 fails to exceed high reference voltage 243 during time window 313 when both input signal 201 and delayed-version of input signal 241 are at a low state. Accordingly, a short between the signal line and ground is detected during time window 313. During time window 314, the short to ground is not detected, but no damage results since no current would be flowing through resistive element 208.

During period 306 when a signal path is shorted to the bus voltage, logic elements 254 and 258 may generate short-to-bus control signal 205B when driver stage output signal 203 fails to fall below low reference voltage 247 during time window 316 when both input signal 201 and delayed-version of input signal 241 are at a high state. Accordingly a short between the signal line and the bus voltage is detected during time window 316.

In the embodiments of the present invention that include comparator 262, AND gate 264 and OR gate 268, the short-circuit condition may be detected because driver stage output signal 203 exceeds high reference voltage 261 during time window 315. In these embodiments, the short-circuit condition may be indicated by the high state of short-to-bus control signal 205B during time window 315.

In the embodiments of the present invention that do not include comparator 262, AND gate 264 and OR gate 268, during time window 315 the short-circuit condition is not detected but little or no damage results since the current that may flow through resistive element 208 may, for example, be limited to the difference between the signal voltage (e.g., VDD) and the bus or supply voltage, although the scope of the invention is not limited in this respect.

As can be seen, unlike some conventional approaches that measure currents during short circuits, embodiments of the present invention use output levels of driver stage 202 measured at bond pad 206. Embodiments of the present invention allow both types of short circuits (e.g., shorts to ground and shorts to the bus voltage) to be detected allowing the particular type of short circuit to be signaled. Furthermore, short circuits may be detected within a one-bit duration (i.e., before a next transition of input signal 201).

In some embodiments, an immediate disabling of driver stage 202 may be suppressed in the case of brief short-circuit conditions. In these embodiments, predriver logic 210 may count several edges of one of control signals 205 instead of reacting at the first edge. In these embodiments, predriver logic 210 may count the edges of one of control signals 205 when one of control signals 205 indicate a short-circuit condition.

Furthermore, when driver stage 202 is implemented in a chip, separate or additional pins on the chip may not be necessary because the voltage at bond pad 206 may be measured by internal circuitry of the interface. Some embodiments of the invention may be suitable for both loaded and unloaded interfaces. Furthermore, the capability of driver stage 202 is not reduced by the short circuit detection.

Figure 4:
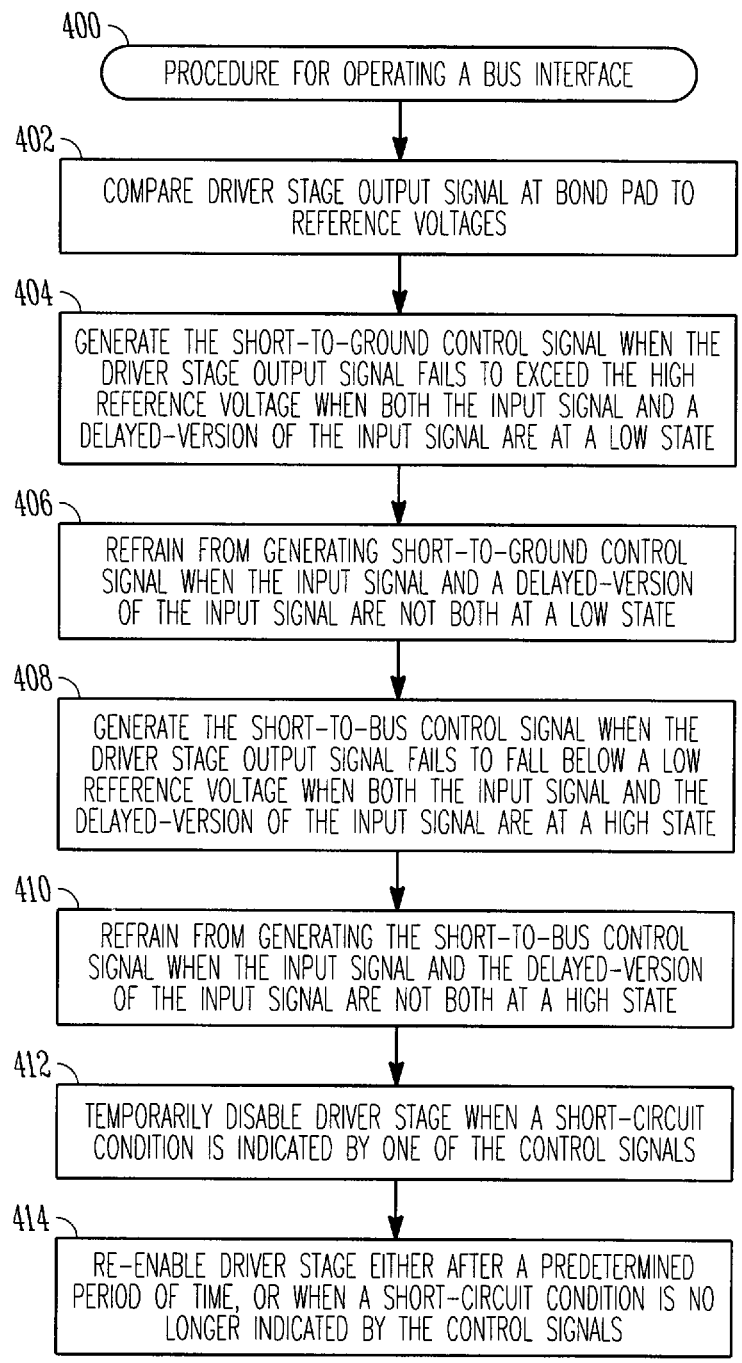
FIG. 4 is a procedure for operating a bus interface in accordance with some embodiments of the present invention.

FIG. 4 is a procedure for operating a bus interface in accordance with some embodiments of the present invention. Procedure 400 may be performed by a bus interface, such as bus interface 200 (FIG. 2), although other bus interface configurations may also be used to perform procedure 400.

Referring to FIGS. 2, 3 and 4 together, in operation 402, driver stage output signal 203 at bond pad 206 may be compared to reference voltages, such as high reference voltage 243 and low reference voltage 247. Operation 402 may be performed by comparators 244 and 248 of evaluation logic 204, although the scope of the invention is not limited in this respect. In some embodiments, driver stage output signal 203 at bond pad 206 may also be compared to high reference voltage 261.

In operation 404, short-to-ground control signal 205A may be generated when driver stage output signal 203 fails to exceed high reference voltage 243 when both input signal 201 and delayed-version of input signal 241 are at a low state. Operation 404 may be performed by evaluation logic 204, although the scope of the invention is not limited in this respect.

Operation 406 comprises refraining from generating short-to-ground control signal 205A when input signal 201 and delayed-version of input signal 241 are not both at a low state. Operation 406 may be performed by evaluation logic 204, although the scope of the invention is not limited in this respect.

In operation 408, short-to-bus control signal 205B may be generated when driver stage output signal 203 fails to fall below low reference voltage 247 when both input signal 201 and delayed-version of input signal 241 are at a high state. Operation 408 may be performed by evaluation logic 204, although the scope of the invention is not limited in this respect.

Operation 410 comprises refraining from generating short-to-bus control signal 205B when both input signal 201 and delayed-version of input signal 241 are not both at a high state. Operation 410 may be performed by evaluation logic 204, although the scope of the invention is not limited in this respect.

In the embodiments of the present invention that detect when a signal path is at a high state and is shorted to the bus voltage (e.g., embodiments that may include comparator 262, AND gate 264, and OR gate 268), operation 410 may be skipped. In these embodiments, short-to-bus control signal 205B may be provided when neither input signal 201 nor delayed-version of input signal 241 are at a high state, such as during time window 315.

Operation 412 comprises temporarily disabling driver stage 202 when a short-circuit condition is indicated by one of the control signals. Operation 412 may be performed by predriver logic 210, although the scope of the invention is not limited in this respect.

Operation 414 comprises re-enabling driver stage 202 either after a predetermined period of time or when the short-circuit condition is no longer indicated by either of the control signals. Operation 414 may be performed by predriver logic 210, although the scope of the invention is not limited in this respect.

Although the individual operations of procedure 400 are illustrated and described as separate operations, one or more of the individual operations may be performed concurrently, and nothing requires that the operations be performed in the order illustrated.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or non-volatile memory or a combination thereof.

Embodiments of the invention may be implemented in one or a combination of hardware, firmware, and software. Embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disk storage media, optical storage media, flash-memory devices, and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A bus interface comprising:
pre-driver logic to receive an input signal and a first control signal or a second control signal;
a driver stage coupled to the pre-driver logic to receive at least one signal from the pre-driver logic and to generate a driver stage output signal; and
evaluation logic to determine when a short-circuit condition exists on an output signal path based on a voltage level at a bond pad and a state of the input signal, the evaluation logic including a first logic gate coupled to the pre-driver logic and a second logic gate coupled to the pre-driver logic, the first logic gate to provide the first control signal to the pre-driver logic and the second logic gate is coupled to an additional logic gate, the additional logic gate to provide the second control signal to the pre-driver logic, and wherein the evaluation logic further comprises a first plurality of logic elements to generate a short-to-ground control signal when the driver stage output signal fails to exceed a high reference voltage, the first plurality of logic elements including the first logic gate, and a second plurality of logic elements to generate a short-to-bus control signal when the driver stage output signal fails to fall below a low reference voltage, the second plurality of logic elements including the second logic gate and the additional logic gate,
wherein the driver stage output signal is provided to the bond pad by the driver stage, and
wherein the driver stage is disabled when the short-circuit condition is indicated by the first control signal or the second control signal provided by the evaluation logic, the first control signal and the second control signal generated based on the voltage level of the bond pad, the state of the input signal, and a state of a delayed version of the input signal,
wherein the predriver logic is to re-enable the driver stage either after a predetermined period of time or when the first control signal or the second control signal do not indicate that the short-circuit condition exists,
wherein the predriver logic tristates the driver stage when the short-circuit condition is indicated by the first control signal or the second control signal,
wherein the first control signal comprises the short-to-ground control signal and the second control signal comprises the short-to-bus control signal,
wherein the first plurality of logic elements generate the short-to-ground control signal when the driver stage output signal fails to exceed the high reference voltage when both the input signal and the delayed-version of the input signal are at a low state, and
wherein the second plurality of logic elements generate the short-to-bus control signal when the driver stage output signal fails to fall below a low reference voltage when both the input signal and the delayed-version of the input signal are at a high state.

2. The interface of claim 1 wherein the predriver logic counts edges of the first control signal or the second control signal when a short-circuit condition is indicated and delays disabling the driver stage for a predetermined number of the edges.

3. The interface of claim 1 wherein the first plurality of logic elements refrain from generating the short-to-ground control signal when the input signal and the delayed-version of the input signal are not both at the low state, and
wherein the second plurality of logic elements refrain from generating the short-to-bus control signal when the input signal and the delayed-version of the input signal are not both at the high state.

4. The interface of claim 1 wherein the driver stage comprises switching transistors, wherein the evaluation logic further comprises a delay element to delay the input signal and generate the delayed version of the input signal, wherein the delay element delays the input signal by at least a transition time of the switching transistors, and
wherein the predriver logic tristates the driver stage when the short-circuit condition is indicated by the first control signal or the second control signal by placing the switching transistors in a high-ohmic state.

5. The interface of claim 4 wherein the evaluation logic further comprises:
a first comparator to compare the driver stage output signal at the bond pad with the high reference voltage; and
a second comparator to compare the driver stage output signal at the bond pad with the low reference voltage,
wherein the first plurality of logic elements comprise:
a NOR-gate to indicate when both the input signal and the delayed version of the input signal have a same low-state; and
a first AND-gate to generate the short-to-ground control signal when both an output from the first comparator and an output from the NOR-gate are at a high-state, and
wherein the second plurality of logic elements comprise:
a second AND-gate to indicate when both the input signal and the delayed version of the input signal have a high-state; and
a third AND-gate to generate the short-to-bus control signal when both an output from the second comparator and an output from the second AND-gate are at a high-state.

6. The interface of claim 5 wherein the evaluation logic further comprises:
a third comparator to compare the driver stage output signal with a second high reference voltage;
a fourth AND gate responsive to an output of the third comparator and the NOR gate; and
an OR gate responsive to the output of the third AND gate and the fourth AND gate to generate the short-to-bus control signal.

7. The interface of claim 1 wherein the interface is a universal serial bus interface, and
wherein the interface further comprises a driver stage, evaluation logic and predriver logic for each signal line of the interface, and
wherein the short-circuit condition comprises a short between a signal line and earth, or a short between a signal line and a bus voltage.

8. The interface of claim 1 further comprising a series resistive element in the output signal path.

9. A method comprising:
comparing, by evaluation logic, a driver stage output signal at a bond pad to internal reference voltages to generate a first control signal or a second control signal indicative of whether a short-circuit condition exists on a bus, wherein the first control signal and the second control signal are generated based on a voltage level of the bond pad and a state of an input signal;
providing, by a first logic element of the evaluation logic, the first control signal to pre-driver logic;

providing, by a second logic element of the evaluation logic, the second control signal to the pre-driver logic;

generating the first control signal when a driver stage output signal fails to exceed a high reference voltage;

generating the second control signal when the driver stage output signal fails to fall below a low reference voltage;

temporarily disabling, by the pre-driver logic, the driver stage of a bus interface when a short-circuit condition is indicated by the first control signal or the second control signal;

re-enabling the driver stage when the first control signal or the second control signal does not indicate that the short-circuit condition exists, wherein the first control signal comprises a short-to-ground control signal and a second control signal comprises a short-to-bus control signal;

counting edges of the first control signal or the second control signal when a short-circuit condition is indicated; and delaying disabling the driver stage for a predetermined number of the edges, wherein the short-to-ground control signal is generated when the driver stage output signal fails to exceed the high reference voltage when both the input signal and a delayed-version of the input signal are at a low state, and wherein the short-to-bus control signal is generated when the driver stage output signal fails to fall below a low reference voltage when both the input signal and the delayed-version of the input signal are at a high state.

10. The method of claim 9 further comprising:

refraining from generating the short-to-ground control signal when the input signal and the delayed-version of the input signal are not both at the low state; and refraining from generating the short-to-bus control signal when the input signal and the delayed-version of the input signal are not both at the high state.

11. The method of claim 9 wherein the temporarily disabling is performed when either the short-to-ground control signal or the short-to-bus control signal indicates a short-circuit condition, and wherein the driver stage is re-enabled either after a predetermined period of time or when neither the short-to-ground control signal nor the short-to-bus control signal indicate a short-circuit condition.

12. The method of claim 9 wherein the driver stage output signal is generated by switching transistors, wherein the method further comprises delaying the input signal by at least a transition time of the switching transistors to provide a delayed version of the input signal.

13. The method of claim 9 wherein the interface is a universal serial bus interface, and wherein the interface further comprises a driver stage, evaluation logic and predriver logic for each signal line of the interface, and wherein the short-circuit condition comprises a short between a signal line and earth, or a short between a signal line and a bus voltage.

14. A host system comprising:

interface circuitry for communicating signals over a serial bus with one or more peripherals, wherein the interface circuitry comprises:

pre-driver logic to receive an input signal and a first control signal or a second control signal;

a driver stage coupled to the pre-driver logic to receive at least one signal from the pre-driver logic and to generate a driver stage output signal; and evaluation logic to determine when a short-circuit condition exists on an output signal path of the serial bus based on a voltage level at a bond pad and a state of the input signal, the evaluation logic including a plurality of comparators, each of the plurality of comparators coupled to a respective logic element, wherein a first respective logic element is coupled to the pre-driver logic and provides the first control signal to the pre-driver logic and a second respective logic element is coupled to an additional logic element, the additional logic element being coupled to the pre-driver logic and providing the second control signal to the pre-driver logic, wherein the driver stage output signal is provided to the bond pad by the driver stage, and wherein the driver stage is disabled when the short-circuit condition is indicated by the first control signal or the second control signal provided by the evaluation logic.

15. The host system of claim 14, wherein the predriver logic is to re-enable the driver stage either after a predetermined period of time or when the first control signal or the second control signal do not indicate that the short-circuit condition exists.

16. The host system of claim 15 wherein the predriver logic counts edges of the first control signal or the second control signal when a short-circuit condition is indicated and delays disabling the driver stage for a predetermined number of the edges.

17. The host system of claim 15 wherein the predriver logic tristates the driver stage when the short-circuit condition is indicated by the first control signal or the second control signal.

18. The host system of claim 15 wherein the first control signal comprises a short-to-ground control signal and the second control signal comprises a short-to-bus control signal, wherein the evaluation logic generates the short-to-ground control signal when the driver stage output signal fails to exceed a high reference voltage and generates the short-to-bus control signal when the driver stage output signal fails to fall below a low reference voltage.

19. The host system of claim 18 wherein the driver stage comprises switching transistors, wherein the evaluation logic further comprises a delay element to delay the input signal by at least a transition time of the switching transistors and generate a delayed version of the input signal.

20. The host system of claim 15 wherein the interface is a universal serial bus interface, and wherein the interface further comprises a driver stage, evaluation logic and predriver logic for each signal line of the interface, and wherein the short-circuit condition comprises a short between a signal line and earth, or a short between a signal line and a bus voltage.

21. The host system of claim 20 wherein the interface further comprises a series resistive element in the output signal path.

* * * * *